(12) United States Patent
Kubo et al.

(10) Patent No.: US 12,362,156 B2
(45) Date of Patent: Jul. 15, 2025

(54) SUBSTRATE PROCESSING METHOD AND SUBSTRATE PROCESSING APPARATUS

(71) Applicant: Tokyo Electron Limited, Tokyo (JP)

(72) Inventors: Atsushi Kubo, Tokyo (JP); Tsuyoshi Takahashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 745 days.

(21) Appl. No.: 17/596,129

(22) PCT Filed: May 26, 2020

(86) PCT No.: PCT/JP2020/020692
§ 371 (c)(1),
(2) Date: Dec. 3, 2021

(87) PCT Pub. No.: WO2020/246309
PCT Pub. Date: Dec. 10, 2020

(65) Prior Publication Data
US 2022/0238311 A1    Jul. 28, 2022

(30) Foreign Application Priority Data

Jun. 7, 2019 (JP) .................................. 2019-106896

(51) Int. Cl.
| | |
|---|---|
| C23C 16/00 | (2006.01) |
| C23C 16/40 | (2006.01) |
| C23C 16/455 | (2006.01) |
| H01J 37/32 | (2006.01) |
| H01L 21/02 | (2006.01) |

(52) U.S. Cl.
CPC ...... *H01J 37/32816* (2013.01); *C23C 16/402* (2013.01); *C23C 16/45536* (2013.01); *H01J 37/32449* (2013.01); *H01L 21/02164* (2013.01); *H01L 21/02274* (2013.01); *H01L 21/0228* (2013.01); *H01J 37/32082* (2013.01); *H01J 2237/332* (2013.01)

(58) Field of Classification Search
CPC ............ C23C 16/402; C23C 16/45536; C23C 16/045; C23C 16/4412; C23C 16/50
See application file for complete search history.

(56) References Cited

U.S. PATENT DOCUMENTS

| | | | |
|---|---|---|---|
| 2010/0193955 A1* | 8/2010 | Milligan | ................. C23C 16/32 438/653 |
| 2018/0265974 A1* | 9/2018 | Okura | ............... H01L 21/28556 |

FOREIGN PATENT DOCUMENTS

| | | |
|---|---|---|
| JP | 2006-045460 A | 2/2006 |
| JP | 2012-517101 A | 7/2012 |
| JP | 2017-150059 A | 8/2017 |
| JP | 2018-026524 A | 2/2018 |
| JP | 2018-150612 A | 9/2018 |

(Continued)

*Primary Examiner* — Hai Y Zhang
(74) *Attorney, Agent, or Firm* — Armstrong Teasdale LLP

(57) ABSTRACT

A substrate processing method for performing a predetermined process on a substrate includes performing, a plurality of times, a cycle including (a) supplying a first processing gas into a processing container to which an exhaust pipe is connected and which accommodates the substrate and (b) supplying a second processing gas into the processing container, wherein at least one of (a) and (b) includes (c) introducing a ballast gas into the exhaust pipe and forming plasma of the processing gas supplied into the processing container.

5 Claims, 7 Drawing Sheets

(56) References Cited

FOREIGN PATENT DOCUMENTS

| KR | 10-2017-0101138 A | 9/2017 |
|----|-------------------|--------|
| KR | 10-2018-0105587 A | 9/2018 |

* cited by examiner

SUBSTRATE PROCESSING METHOD AND SUBSTRATE PROCESSING APPARATUS

CROSS-REFERENCE TO RELATED APPLICATIONS

This application is a National Stage Application of International Patent Application No. PCT/JP2020/020692, having an International Filing Date of May 26, 2020, which claims the benefit of priority to Japanese Patent Application No. 2019-106896, filed Jun. 7, 2019, each of which is hereby incorporated by reference herein.

TECHNICAL FIELD

The present disclosure relates to a substrate processing method and a substrate processing apparatus.

BACKGROUND

Patent Document 1 discloses a thin film forming method for forming a film by an ALD (Atomic Layer Deposition) method, particularly PEALD (Plasma Enhanced ALD). In this thin film forming method, the opening degree of a conductance valve provided in an exhaust passage connecting a processing container capable of being depressurized and a vacuum pump is maintained at a reference value during an ALD film forming process. This reference value is identified during a preparatory period prior to the start of the ALD film forming process.

PRIOR ART DOCUMENT

Patent Document

Patent Document 1: Japanese Laid-open Publication No. 2006-45460

The present disclosure provides some embodiments of a technique capable of allowing the pressure in a processing container to quickly reach a desired pressure in a step of supplying a processing gas into the processing container to form plasma of the processing gas in a substrate processing process such as an ALD process using plasma or the like.

SUMMARY

According to one embodiment of the present disclosure, there is provided a substrate processing method for performing a predetermined process on a substrate, including: performing, a plurality of times, a cycle including (a) supplying a first processing gas into a processing container to which an exhaust pipe is connected and which accommodates the substrate and (b) supplying a second processing gas into the processing container, wherein at least one of (a) and (b) includes (c) introducing a ballast gas into the exhaust pipe and forming plasma of the processing gas supplied into the processing container.

According to the present disclosure, it is possible to allow the pressure in a processing container to quickly reach a desired pressure in a step of supplying a processing gas into the processing container to form plasma of the processing gas in a substrate processing process such as an ALD process using plasma or the like.

DETAILED DESCRIPTION

For example, in a manufacturing process of a semiconductor device or the like, various processes such as a film forming process and an etching process are performed on a semiconductor wafer (hereinafter referred to as "wafer"). In addition, ALD may be used as a method for forming a film on a wafer. In this ALD, a cycle that includes an adsorption step of supplying a raw material gas to be adsorbed on a surface of a wafer into a processing container having a vacuum atmosphere and a reaction step of supplying a reaction gas (also referred to as a reducing gas) reacting with the raw material gas into the processing container is performed a plurality of times. As a result, an atomic layer of a reaction product is deposited on the surface of the wafer to form a film. In PEALD, which is a kind of ALD method, plasma of the reaction gas is formed in the reaction step when the film is formed by ALD.

Figure 1:
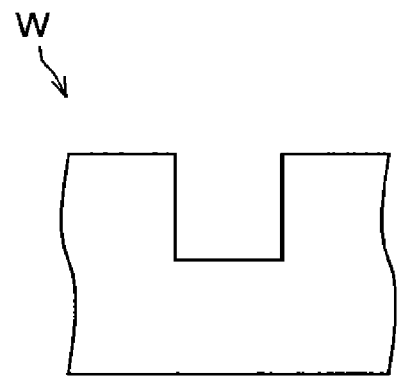
FIG. 1 is a diagram showing an example of a wafer to be processed.
Figure 2:
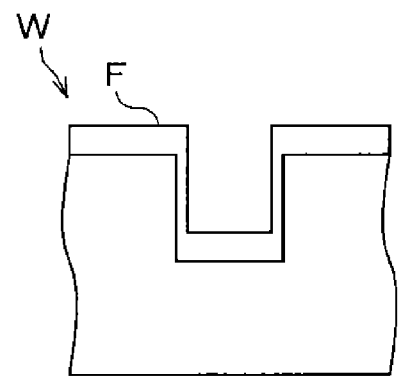
FIG. 2 is a diagram showing an example in which anisotropic film formation is performed on the wafer shown in FIG. 1.
Figure 3:
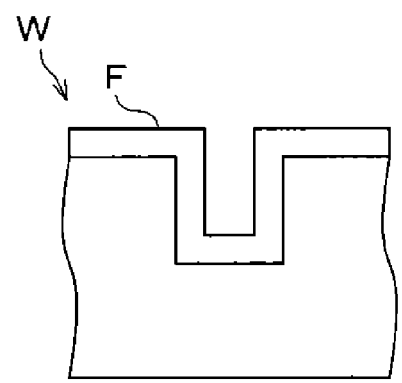
FIG. 3 is a diagram showing an example in which isotropic film formation is performed on the wafer shown in FIG. 1.

By the way, in the adsorption step and the reaction step in PEALD, there are suitable pressures as the pressures in the processing container. For example, in the reaction step in which the plasma of the reaction gas is formed, there is a suitable pressure zone as the pressure zone in the processing container for the following reasons. That is, the ratios of charged particles and neutral particles in the plasma of the gas contained in the processing container differ depending on the pressure in the processing container. Furthermore, the ratio of ions in the charged particles and the ratio of radicals in the neutral particles also vary depending on the pressure in the processing container. As used herein, the term "proportion" refers to a density proportion or a flux proportion on the wafer surface. Further, if the proportions of the charged particles and the neutral particles in the plasma in the reaction step are different, the mode of film formation by PEALD becomes different. For example, as shown in FIG. 1, if the proportion of ions as charged particles is large when a film is formed on a wafer W having a recess on its surface, the ions are drawn into the wafer W by a bias voltage applied to the stage on which the wafer W is placed. Therefore, a film F is anisotropically formed as shown in FIG. 2. Specifically, a thick film F is formed on the top surface and the bottom surface forming the recess of the wafer W, and a thin film F is formed on the side surface of the recess. On the other hand, when the proportion of neutral particles is large, even if a bias voltage is applied, unlike the case of ions, the force that draws the neutral particles toward the wafer does not act on the neutral particles. Therefore, as shown in FIG. 3, a film F is isotropically formed. Specifically, a film F having substantially the same thickness is formed on all of the top surface, the bottom surface, and the side surface forming the recess of the wafer W. Whether isotropic film formation or anisotropic film formation is required depends on the shape or the like of the wafer to be processed. Furthermore, the proportions suitable as the proportion of ions in the charged particles and the proportion of radicals in the neutral particles in the plasma also differ depending on the type or the like of the film to be formed. Therefore, in the reaction step in which the plasma of the reaction gas is formed, there is a suitable pressure zone suitable as the pressure zone in the processing container.

However, if the opening degree of the conduction valve provided in the exhaust passage connecting the processing container and the vacuum pump is maintained at a reference value during the PEALD process as in Patent Document 1, for example, it takes time from the start of the reaction step to the time at which the pressure inside the processing container becomes suitable for the reaction step. Therefore, there is room for improvement in terms of throughput. Further, by using a so-called APC (Auto Pressure Control) valve or by moving the stage on which the wafer W is placed up and down in the processing container to increase or decrease the volume of the processing space, it is possible to shorten the time until the above-mentioned suitable pressure is obtained. However, since these methods involve the rotation of the valve body of the APC valve and the movement of the stage, it is not possible to sufficiently shorten the time required to reach the above-mentioned suitable pressure.

The above points are also common to an ALE (Atomic Layer Etching) process using plasma.

Therefore, the technique according to the present disclosure can allow the pressure inside a process container to quickly reach a desired pressure zone in a step of supplying a processing gas into the processing container to form plasma of the processing gas in an ALD process or an ALE process using plasma.

Hereinafter, the substrate processing method and the substrate processing apparatus according to the present embodiment will be described with reference to the drawings. In the subject specification and the drawings, elements having substantially the same functional configuration are designated by like reference numerals, and duplicate description is omitted.

Figure 4:
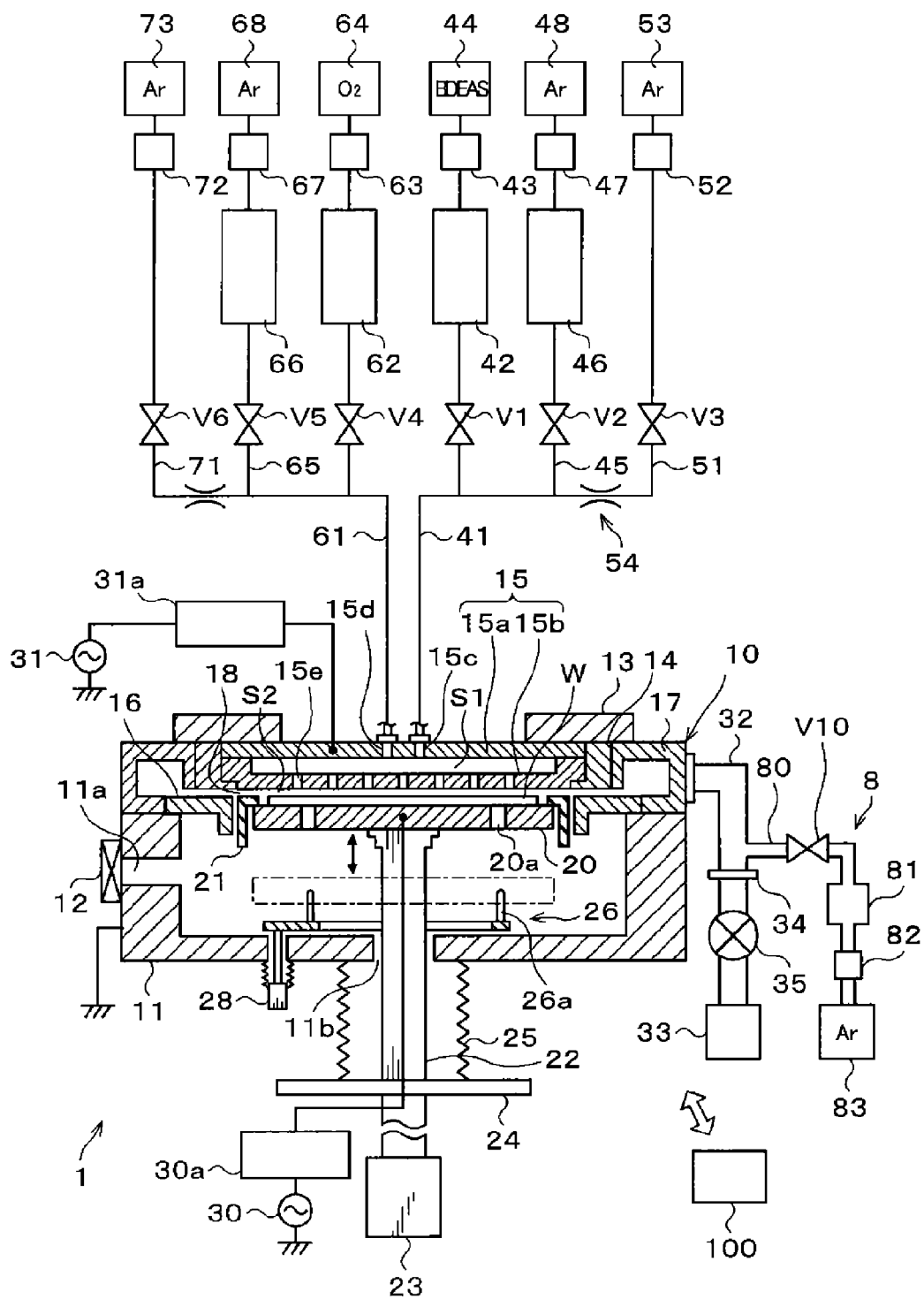
FIG. 4 is a vertical cross-sectional side view of a film forming apparatus according to the present embodiment.

FIG. 4 is a vertical cross-sectional diagram schematically showing a film forming apparatus as a substrate processing apparatus according to the present embodiment. The film forming apparatus 1 shown in FIG. 4 is a single-wafer type apparatus. Further, the film forming apparatus 1 forms a $SiO_2$ film on a wafer W as a substrate by PEALD. Specifically, the film forming apparatus 1 forms a $SiO_2$ film on a wafer W by performing, a plurality of times, a cycle that includes an adsorption step of supplying a raw material gas as a first processing gas into a below-described processing container 10 in which the wafer W is accommodated, and a reaction step of supplying a reaction gas as a second processing gas into the processing container 10 to form plasma of the reaction gas. More specifically, the film forming apparatus 1 performs a cycle that includes, in the named order, the above-mentioned adsorption step, a step of supplying a purge gas as a replacement gas into the processing container 10 and discharging the raw material gas in the processing container 10, the above-mentioned reaction step, and a step of supplying a purge gas into the processing container 10 and discharging the reducing gas in the processing container 10. As a result, the $SiO_2$ film is formed on the wafer W. During the film forming process by PEALD, a carrier gas for introducing the raw material gas and the reaction gas into the processing container 10 is continuously supplied into the processing container 10.

The film forming apparatus 1 is configured to be depressurized and includes a processing container 10 for accommodating a wafer W. The processing container 10 includes a container body 11 formed in a bottom-closed cylindrical shape. On the side wall of the container body 11, an opening 11a as a loading/unloading port for the wafer W and a gate valve 12 for opening and closing the opening 11a are provided. Further, an exhaust duct 17 to be described later is provided on the container body 11 to form a part of the side wall of the processing container 10.

Further, a stage 20 on which the wafer W is placed is provided in the processing container 10. The stage 20 constitutes a lower electrode. A heater (not shown) is built in the stage 20 and can heat the wafer W placed on the stage 20 to a predetermined temperature. Radio-frequency power for bias is supplied to the stage 20 from a radio-frequency power source 30 provided outside the processing container 10 via a matcher 30a.

Further, the stage 20 is provided with a cylindrical cover member 21 that surrounds the stage 20. An upper end of a support column 22 extending in the vertical direction is connected to the central portion of the lower surface of the stage 20. The lower end of the support column 22 extends to the outside of the processing container 10 through an opening 11b provided at the bottom of the processing container 10 and is connected to an elevating mechanism 23. By driving the elevating mechanism 23, the stage 20 can be moved up and down between a transfer position indicated by a one-dot chain line and a processing position above the transfer position. The transfer position is a position where the stage 20 waits when the wafer W is delivered between a transfer mechanism (not shown) for the wafer W entering the processing container 10 through the opening 11a of the processing container 10 and support pins 26a described later. The processing position is a position where the wafer W is processed.

A flange 24 is provided on the support column 22 outside the processing container 10. A bellows 25 is provided between the flange 24 and the portion of the bottom wall of the processing container 10 through which the support column 22 penetrates, to surround the outer peripheral portion of the support column 22. As a result, an airtight seal of the processing container 10 is maintained.

Below the stage 20 in the processing container 10, a wafer elevating member 26 having a plurality of, for example, three support pins 26a is provided. The wafer elevating member 26 can be moved up and down by an elevating mechanism 28. Further, as the wafer elevating member 26 is moved up and down, the support pins 26a protrude and retract from the upper surface of the stage 20 through through-holes 20a formed in the stage 20 to deliver the wafer W.

An annular insulating support member 13 is provided on the upper side of the exhaust duct 17 in the processing container 10. A shower head support member 14 made of quartz is provided on the lower surface side of the insulating support member 13. The shower head support member 14 supports a shower head 15 which is a gas introduction part for introducing a processing gas into the processing container 10 and which constitutes an upper electrode.

The shower head 15 has a disk-shaped head body portion 15a and a shower plate 15b connected to the head body portion 15a. A gas diffusion space S1 is formed between the head body portion 15a and the shower plate 15b. The head body portion 15a and the shower plate 15b are made of metal. Two gas supply paths 15c and 15d leading to the gas diffusion space S1 are formed in the head body portion 15a. A large number of gas discharge holes 15e leading from the gas diffusion space S1 are formed in the shower plate 15b. Further, radio-frequency power for plasma formation is supplied to the shower head 15 from a radio-frequency power source 31 provided outside the processing container 10 via a matcher 31a.

Inside the processing container 10, an annular member 16 is provided so that the inner wall of the processing container 10 protrudes above the opening 11a. The annular member 16 is arranged to come close to the outside of the cover member 21 of the stage 20 at the processing position and to surround the cover member 21. Further, an exhaust duct 17 formed to be curved in an annular shape is provided on the upper portion of the side wall of the processing container 10. The inner peripheral surface side of the exhaust duct 17 is opened on the annular member 16 in the circumferential direction. The processing space S2 can be evacuated through a gap 18 formed between the cover member 21 and the lower peripheral edge portion of the shower plate 15b.

One end of the exhaust pipe 32 is connected to the exhaust duct 17, and the other end of the exhaust pipe 32 is connected to an evacuation pump 33 as an exhaust device. An APC valve 34 and an on-off valve 35 are provided sequentially from the upstream side between the exhaust duct 17 and the evacuation pump 33 in the exhaust pipe 32.

Further, the downstream ends of gas flow paths 41 and 61 are connected to the gas supply paths 15c and 15d, respectively.

The upstream end of the gas flow path 41 is connected to a supply source 44 of a BDEAS (bisdiethylaminosilane) gas, which is a raw material gas, via a valve V1, a gas storage tank 42, and a flow rate adjustment part 43 sequentially from the downstream side. The flow rate adjustment part 43 is composed of a mass flow controller and is configured to adjust the flow rate of the BDEAS gas supplied from the supply source 44 to the downstream side. Other flow rate adjustment parts 47, 52, 63, 67, 72 and 82, which will be described later, are also configured in the same manner as the flow rate adjustment part 43 to adjust the flow rate of the gas supplied to the downstream side of the flow path.

The gas storage tank 42 temporarily stores the BDEAS gas supplied from the supply source 44 before supplying the BDEAS gas into the processing container 10. After the BDEAS gas is stored in this way and the pressure inside the gas storage tank 42 is increased to a desired pressure, the BDEAS gas is supplied from the gas storage tank 42 to the processing container 10. The supply and cutoff of the BDEAS gas from the gas storage tank 42 to the processing container 10 is performed by opening and closing the valve V1 described above. By temporarily storing the BDEAS gas in the gas storage tank 42 in this way, the BDEAS gas can be stably supplied to the processing container 10 at a relatively high flow rate.

Like the gas storage tank 42, the gas storage tanks 46, 62, 66 and 81, which will be described later, are also gas storage parts that serve to stabilize the flow rates of the respective gases supplied to the processing container 10 or the exhaust pipe 32 by temporarily storing the respective gases supplied from the gas supply sources on the upstream side of the gas flow path. Then, the supply and cutoff of the gases from the gas storage tanks 46, 62, 66 and 81 from the processing container 10 or the exhaust pipe 32 are performed by opening and closing the valves V2, V4, V5 and V10 provided on the downstream side of the respective gas storage tanks 46, 62, 66 and 81.

Further, the downstream end of the gas flow path 45 is connected to the gas flow path 41 on the downstream side of the valve V1. The upstream end of the gas flow path 45 is connected to the Ar gas supply source 48 via the valve V2, the gas storage tank 46, and the flow rate adjustment part 47 in the named order from the downstream side.

Further, the downstream end of a gas flow path 51 is connected to the gas flow path 45 on the downstream side of the valve V2. The upstream end of the gas flow path 51 is connected to the Ar gas supply source 53 via a valve V3 and the flow rate adjustment part 52 in the named order from the downstream side. An orifice 54 is formed in the gas flow path 51 on the downstream side of the valve V3. That is, the diameter of the gas flow path 51 on the downstream side of the valve V3 is smaller than the diameter of the gas flow path 51 on the upstream side of the valve V3 and the diameters of the gas flow paths 41 and 45. Gases are supplied to the gas flow paths 41 and 45 by the gas storage tanks 42 and 46 at relatively large flow rates. It is possible for the orifice 54 to prevent the gases supplied to the gas flow paths 41 and 45 from flowing back through the gas flow path 51.

By the way, the Ar gas supplied from the Ar gas supply source 48 to the gas flow path 45 is supplied into the processing container 10 to perform purging. On the other hand, the Ar gas supplied from the Ar gas supply source 53 to the gas flow path 51 is a carrier gas for the BDEAS gas. As described above, the carrier gas is continuously supplied into the processing container 10 during the processing of the wafer W. The carrier gas is also supplied into the processing container 10 when purging is performed. Therefore, the time zone in which the carrier gas is supplied into the processing container 10 overlaps with the time zone in which the Ar gas is supplied from the supply source 48 into the processing container 10 to perform purging. The carrier gas is also used in the purging. However, for the sake of convenience of description, the gas supplied from the supply source 48 to the gas flow path 45 is described as a purge gas, and the gas supplied from the supply source 53 to the gas flow path 51 is described as a carrier gas. The carrier gas is also a backflow-preventing gas for preventing the BDEAS gas from flowing back through the gas flow path 51.

Subsequently, the gas flow path 61 connected to the gas supply path 15d of the processing container 10 will be described. The upstream end of the gas flow path 61 is connected to the supply source 64 of the $O_2$ gas, which is a reaction gas, via the valve V4, the gas storage tank 62, and the flow rate adjustment part 63 in the named order from the downstream side. The gas flow path 61 is a reaction gas flow path and is formed independently of the gas flow path 41, which is a raw material gas flow path.

The downstream end of the gas flow path 65 is connected to the gas flow path 61 on the downstream side of the valve V4. The upstream end of the gas flow path 65 is connected to the Ar gas supply source 68 via the valve V5, the gas storage tank 66, and the flow rate adjustment part 67 in the named order from the downstream side. Further, the downstream end of the gas flow path 71 is connected to the gas flow path 65 on the downstream side of the valve V5. The upstream end of the gas flow path 71 is connected to the Ar gas supply source 73 via the valve V6 and the flow rate adjustment part 72 in the named order from the downstream side. An orifice 74 is formed in the gas flow path 71 on the downstream side of the valve V6. That is, the diameter of the gas flow path 71 on the downstream side of the valve V6 is smaller than the diameter of the gas flow path 71 on the upstream side of the valve V6 and the diameters of the gas flow paths 61 and 65. Like the orifice 54, the orifice 74 is formed to prevent the gases supplied to the gas flow paths 61 and 65 at relatively large flow rates from flowing back through the gas flow path 71.

The Ar gas supplied from the supply source 68 to the gas flow path 65 is supplied into the processing container 10 to perform purging. The Ar gas supplied from the supply source 73 to the gas flow path 71 is a carrier gas for the $O_2$ gas and is also used for purging like the carrier gas for the BDEAS gas. However, for the sake of convenience of description, the gas supplied from the supply source 68 to the gas flow path 65 is described as a purge gas, and the gas supplied from the supply source 73 to the gas flow path 71 is described as a carrier gas. The carrier gas is also a backflow-preventing gas for preventing the $O_2$ gas from flowing back through the gas flow path 71.

By forming the respective gas flow paths as described above, the gas flow path 51 includes the valve V3 and the flow rate adjustment part 52 as a carrier gas supply control device. In the gas flow path 45, the valve V2 and the flow rate adjustment part 47 are provided as a purge gas supply control device distinguished from the carrier gas supply control device. Further, the gas flow path 71 includes the valve V6 and the flow rate adjustment part 72 as another carrier gas supply control device. The valve V5 and the flow rate adjustment part 67 are provided as another purge gas supply control device distinguished from another carrier gas supply control device.

By the way, as described above, the purge gas is supplied to the processing container 10 from both of the gas flow paths 45 and 65. This is to purge not only the BDEAS gas and the 02 gas remaining in the processing container 10, but also the BDEAS gas remaining in the gas flow path 41 on the downstream side of the valve V1 and the $O_2$ gas remaining in the gas flow path 61 on the downstream side of the valve V4. That is, two flow paths for the purge gas are formed to purge the BDEAS gas and the $O_2$ gas more reliably.

Further, the downstream end of a gas flow path 80 is connected to the exhaust pipe 32 on the upstream side of the APC valve 34. The upstream end of the gas flow path 80 is connected to a supply source 83 of an Ar gas as an inert gas, which is a ballast gas, via a valve V10, a gas storage tank 81, and a flow rate adjustment part 82 in the named order from the downstream side. The pressure in the processing space S2 can be adjusted according to the amount of the ballast gas supplied from the gas flow path 80 to the exhaust pipe 32, and the like.

A high-speed valve, which has a very high responsiveness and is used for the valves V1 to V6, is used as the valve V10. In the high-speed valve, the time period from the time at which a control signal is inputted to open the valve to the time at which the valve is actually opened is very short. Further, in the high-speed valve, the time period from the time at which the control signal is inputted to the time at which the valve is actually opened is, for example, about 10 msec. The gas flow path 80, the valve V10, the gas storage tank 81, and the flow rate adjustment part 82 constitute a ballast gas introduction mechanism 8 for introducing the ballast gas into the exhaust pipe 32.

The film forming apparatus 1 configured as described above is provided with a controller 100. The controller 100 is composed of, for example, a computer equipped with a CPU, a memory, and the like, and includes a program storage part (not shown). The program storage part stores programs or the like for realizing a below-described wafer processing process in the film forming apparatus 1 by controlling various devices such as a heater (not shown) in the stage 20, the valves V1 to V6, V10, and 34, and the flow rate adjustment parts 43, 47, 52, 63, 67, 72 and 82. The programs may be recorded on a computer-readable storage medium and may be installed on the controller 100 from the storage medium. In addition, a part or all of the programs may be realized by dedicated hardware (circuit board).

Figure 8:
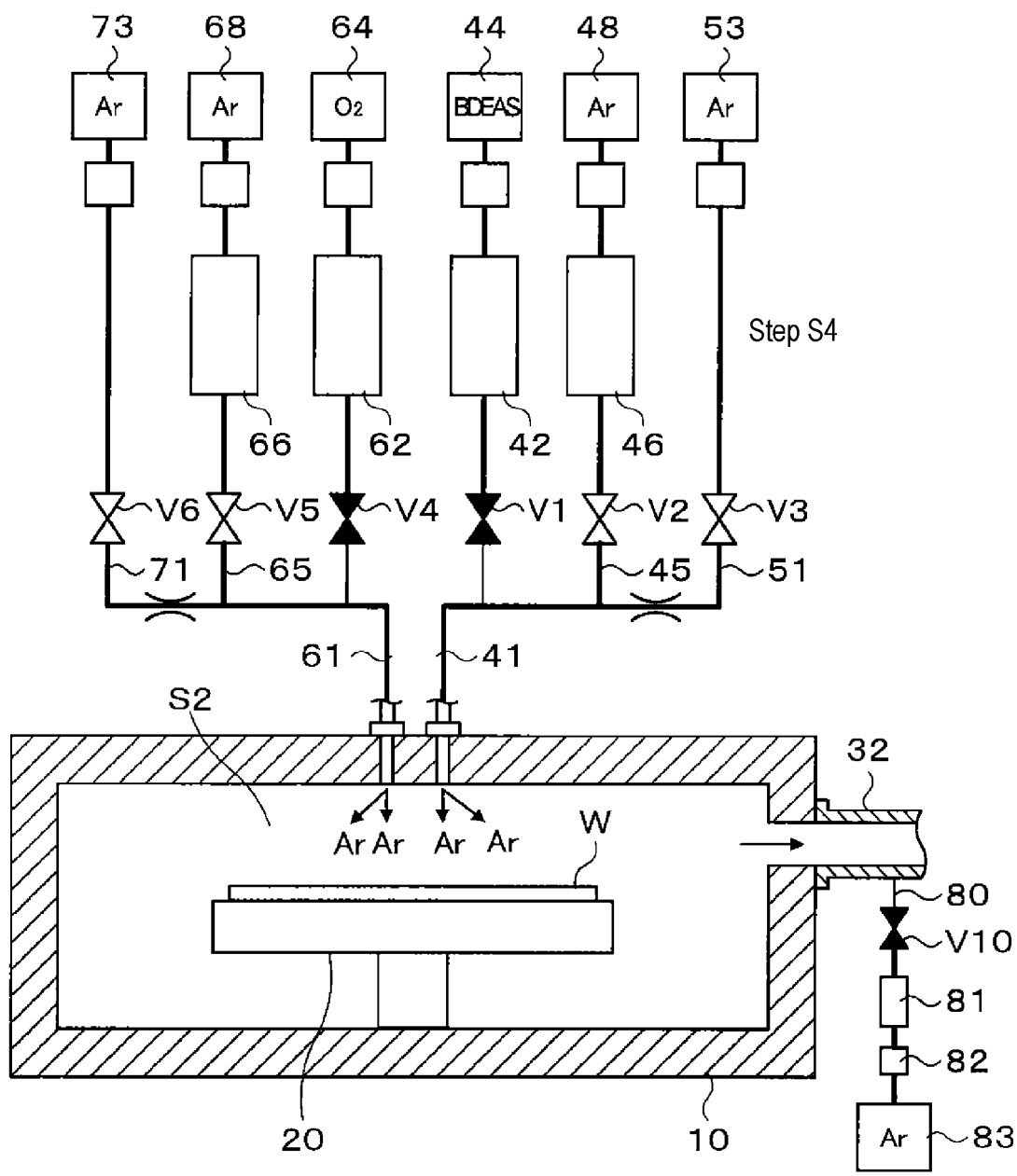
FIG. 8 is a schematic diagram for explaining a process performed by the film forming apparatus shown in FIG. 1.
Figure 9:
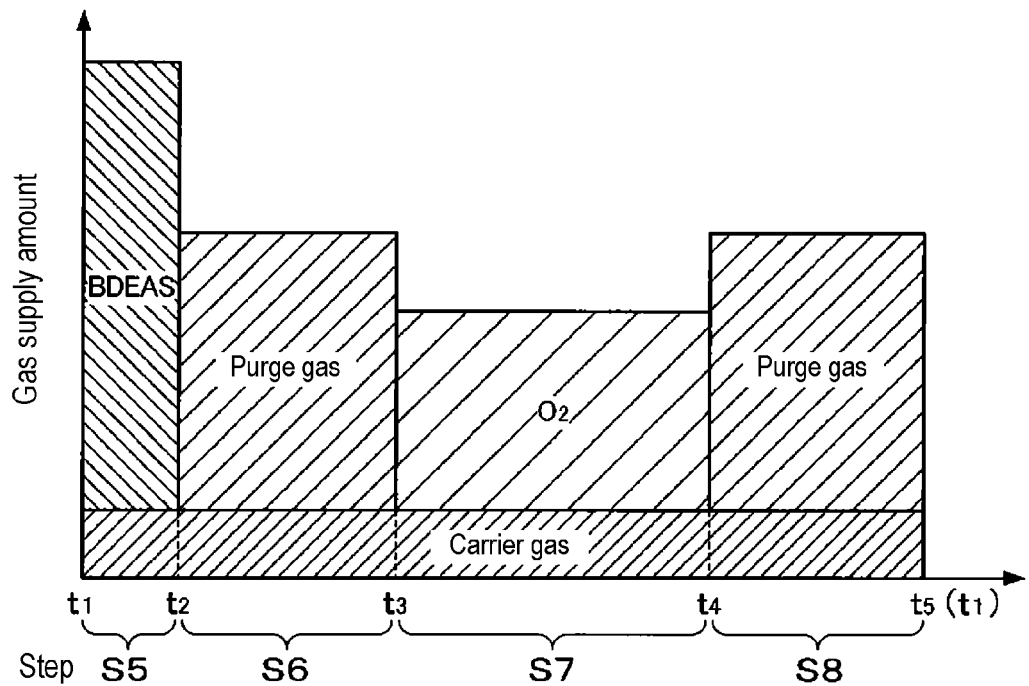
FIG. 9 is a timing chart showing a change in the amount of gas supplied in the process performed by the film forming apparatus shown in FIG. 1

Subsequently, a film forming process performed in the film forming apparatus 1 will be described with reference to FIGS. 5 to 8 that show the open/closed states of the respective valves, and the gas flow states in the respective gas flow paths. In FIGS. 5 to 8, the valves in the open state are shown in white, the valves in the closed state are shown in black, and the gas flow paths through which gases flow toward the downstream side are shown by thick lines. Further, in FIGS. 5 to 8, the processing container 10 and the respective parts in the processing container 10 are shown in a simplified manner as compared with FIG. 4. Moreover, in the following description of the film forming process, the timing chart of FIG. 9 is also referred to as appropriate. In this timing chart, the time zones in which the BDEAS gas, the $O_2$ gas, the carrier gas, and the purge gas flow are shown by rectangular regions with gray scales having different concentrations. The height of each rectangular region corresponds to the amount of the gas supplied into the processing container 10. The larger the height of the rectangular region, the larger the amount of gas supplied.

(Step S1: Wafer Loading)

First, the gate valve 12 is opened while closing the valves V1 to V6 and V10. A transfer mechanism (not shown) holding a wafer W is inserted into the processing container 10 from a vacuum atmosphere transfer chamber (not shown) adjacent to the processing container 10 through the opening 11a. For example, a recess as shown in FIG. 1 is formed on the surface of the wafer W. Next, the wafer W is transferred above the stage 20 located at the above-mentioned transfer position. Then, the wafer W is delivered onto the raised support pins 26a. Thereafter, the transfer mechanism is pulled out from the processing container 10 and the gate valve 12 is closed. At the same time, the support pins 26a are lowered and the stage 20 is raised, whereby the wafer W is placed on the stage 20.

(Step S2: Wafer Heating)

Subsequently, the stage 20 is moved to the above-mentioned processing position to form the processing space S2, and the wafer W is heated to a desired temperature by the heater (not shown) provided in the stage 20. During the heating, the pressure in the processing container 10 is regulated to a desired vacuum pressure by the APC valve 34.

(Step S3: Keeping APC Valve Fully Opened)

After heating the wafer to the desired temperature, the APC valve 34 is fully opened. Thereafter, the APC valve 34 is kept fully opened until film formation is completed.

(Step S4: Supply of Carrier Gas Alone)

Further, the valves V3 and V6 are opened to supply a carrier gas (Ar gas) at a flow rate of, for example, 500 sccm, from the Ar gas supply sources 53 and 73 to the gas flow paths 51 and 71, respectively. That is, the carrier gas is supplied into the processing container 10 at a total flow rate of 1,000 sccm. On the other hand, while closing the valves V1, V4 and V10, a BDEAS gas, an $O_2$ gas and an Ar gas are supplied from the supply sources 44, 64 and 83 to the gas flow paths 41, 61 and 80 at the respective timings. As a result, the BDEAS gas, the $O_2$ gas and the Ar gas are stored in the gas storage tanks 42, 62 and 81, respectively, and the pressures inside the gas storage tanks 42, 62 and 81 are increased.

(Step S5: Adsorption)

Figure 5:
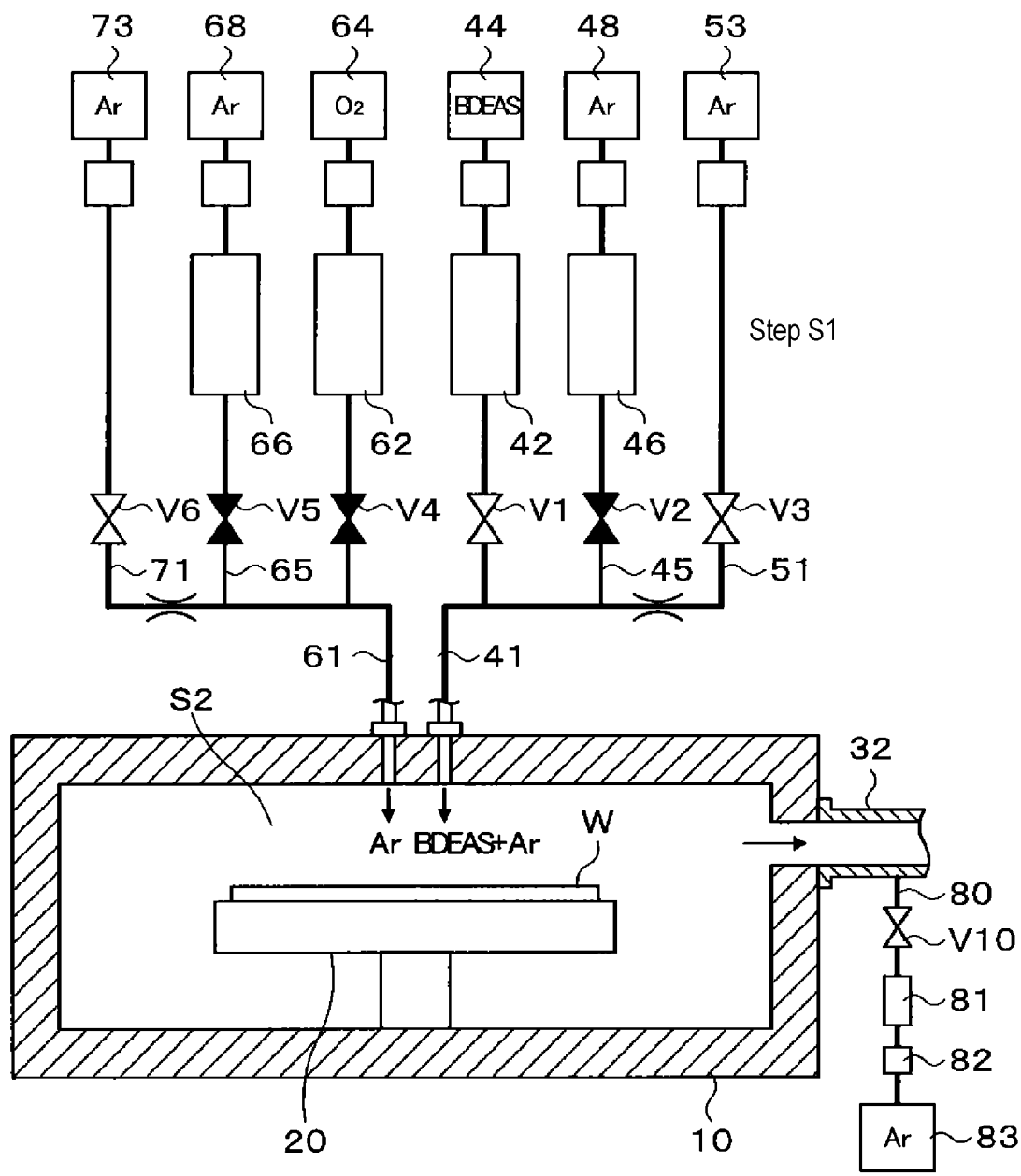
FIG. 5 is a schematic diagram for explaining a process performed by the film forming apparatus shown in FIG. 1.

At time $t_1$ in FIG. 9 at which a predetermined time has elapsed from the start of supply of the carrier gas, the valves V1 and V10 are opened as shown in FIG. 5. As a result, the Ar gas stored in the gas storage tank 81 is supplied into the exhaust pipe 32, and the BDEAS gas stored in the gas storage tank 42 is supplied into the processing container 10, whereby the BDEAS gas is adsorbed to the surface of the wafer W. In this way, the Ar gas as a ballast gas is introduced into the exhaust pipe 32 when the BDEAS gas is supplied to the processing container 10. Therefore, the amount of the gas discharged from the processing space S2 can be quickly changed to a desired value. Accordingly, the pressure in the processing container 10 (specifically, the partial pressure of the BDEAS gas in the processing space S2) can be quickly set within a desired range as compared with the case where the pressure is regulated by the APC valve 34. Since the pressure fluctuation caused by the introduction of the ballast gas is propagated to the exhaust pipe 32 and the like at the speed of sound, the amount of the gas discharged from the processing space S2 can be quickly changed to the desired value. In parallel with the supply of the BDEAS gas into the processing container 10, a purge gas (Ar gas) is supplied from the supply sources 48 and 68 to the gas flow paths 45 and 65, respectively, while closing the valves V2 and V5. As a result, the purge gas is stored in the gas storage tanks 46 and 66, and the pressures inside the gas storage tanks 46 and 66 are increased.

(Step S6: Discharge of Adsorption Gas)

Figure 6:
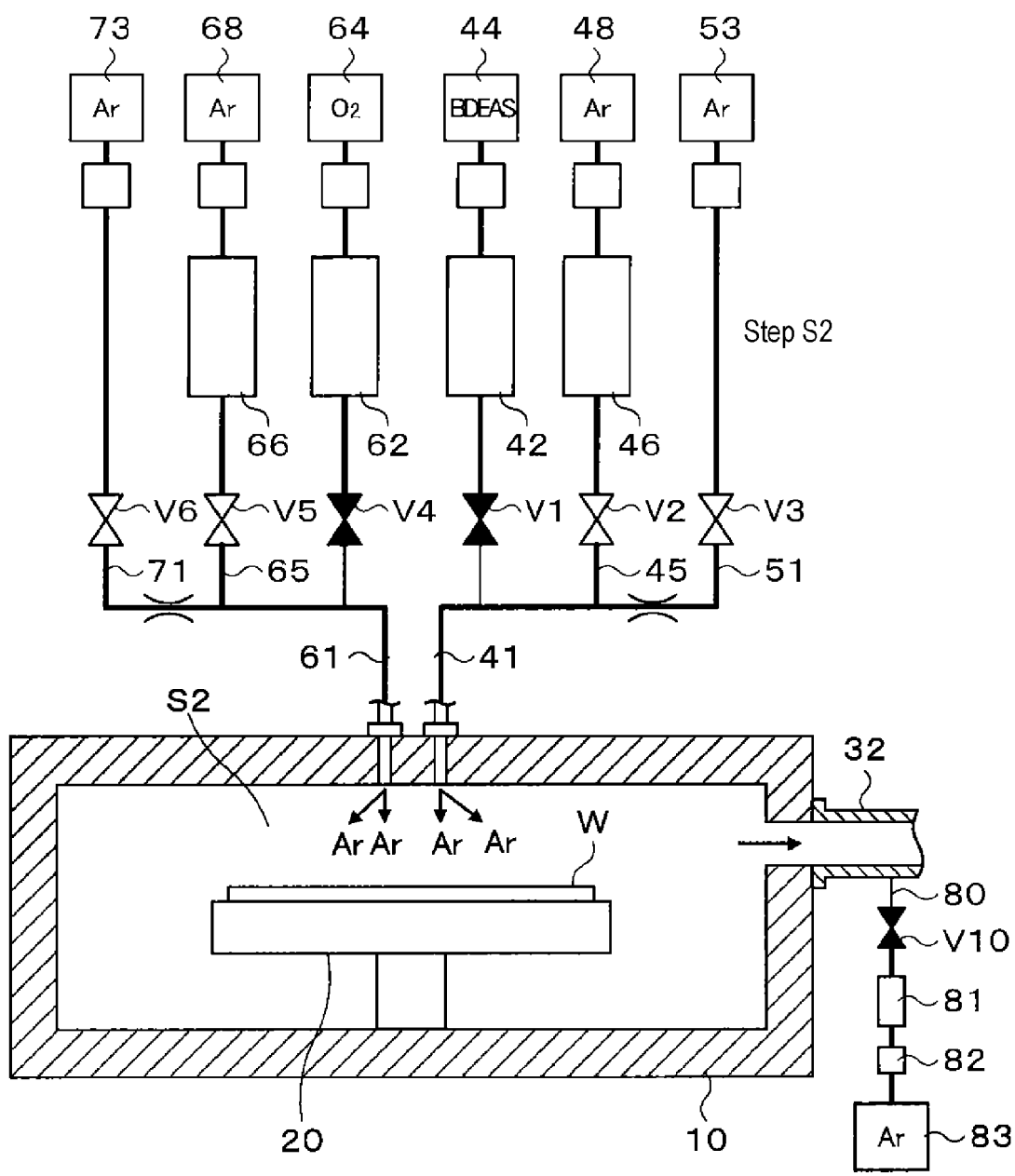
FIG. 6 is a schematic diagram for explaining a process performed by the film forming apparatus shown in FIG. 1.

At time t2 in FIG. 9, for example, 0.05 seconds after time $t_1$, as shown in FIG. 6, the valves V1 and V10 are closed and the valves V2 and V5 are opened. As a result, the supply of the BDEAS gas into the processing container 10 and the supply of the Ar gas into the exhaust pipe 32 are stopped, and the purge gas stored in the gas storage tanks 46 and 66 is supplied into the processing container 10, whereby the BDEAS gas is discharged from the processing container 10. That is, the BDEAS gas atmosphere inside the processing container 10 is replaced with an Ar gas atmosphere. While the inside of the processing container 10 is purged as described above, the valve V1 is closed so that the BDEAS gas supplied from the supply source 44 to the gas flow path 41 is stored in the gas storage tank 42, whereby the pressure inside the gas storage tank 42 is increased. Further, the valve V10 is closed so that the Ar gas supplied from the supply source 83 to the gas flow path 80 is stored in the gas storage tank 81, whereby the pressure inside the gas storage tank 81 is increased.

(Step S7: Reaction)

Figure 7:
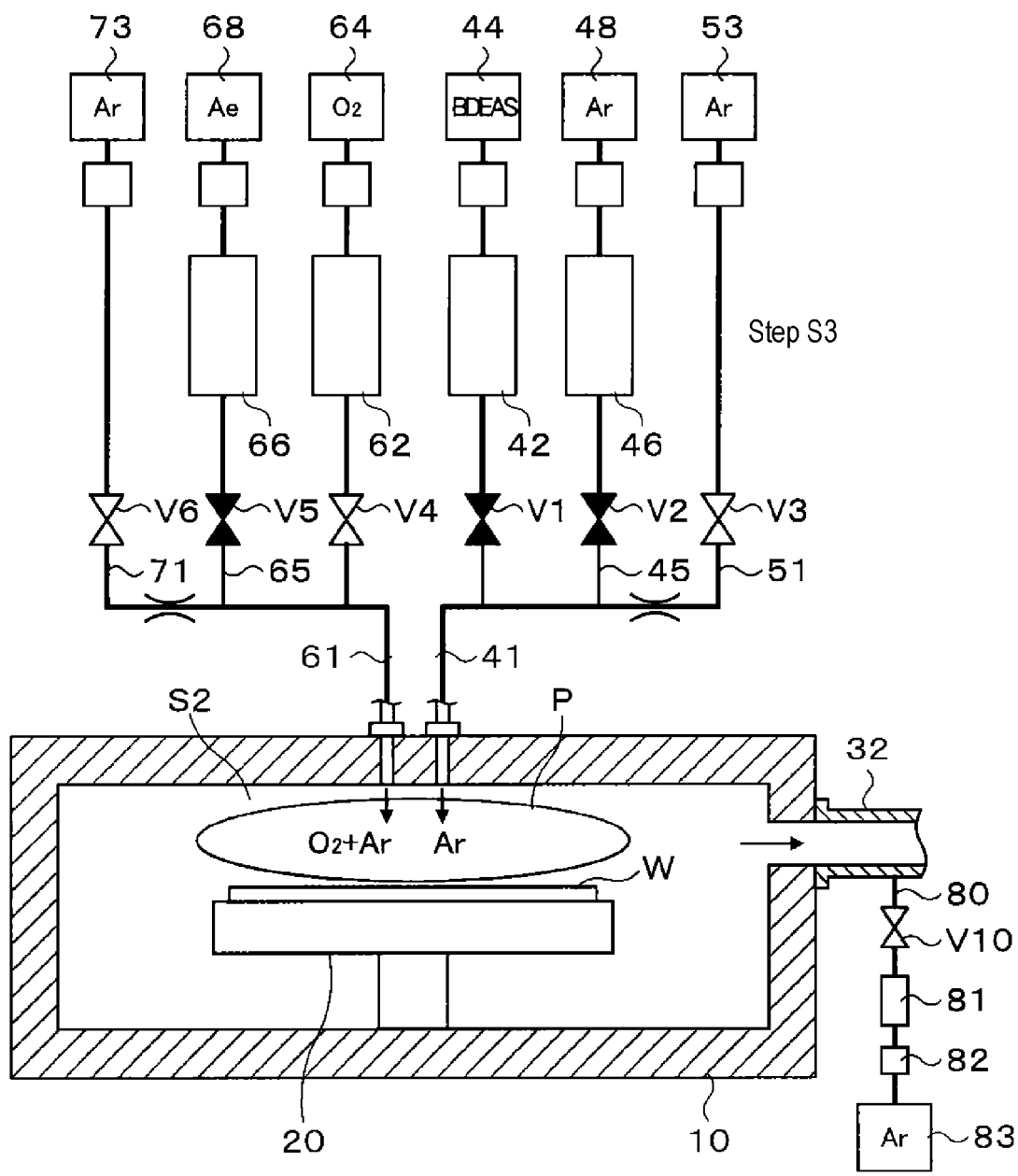
FIG. 7 is a schematic view for explaining a process performed by the film forming apparatus shown in FIG. 1.

At time $t_3$ in FIG. 9, for example, 0.2 seconds after time t2, as shown in FIG. 7, the valves V2 and V5 are closed and the valves V4 and V10 are opened. As a result, the supply of the purge gas into the processing container 10 is stopped, the Ar gas stored in the gas storage tank 81 is supplied into the exhaust pipe 32, and the $O_2$ gas stored in the gas storage tank 62 is supplied into the processing container 10. Further, radio-frequency power is supplied from the radio-frequency power source 31 to the shower head 15, and radio-frequency power is supplied from the radio-frequency power source 30 to the stage 20. As a result, $O_2$ gas plasma P is formed, and active species such as ions and radicals in the plasma P react with the BDEAS gas adsorbed on the surface of the wafer W to form an atomic layer of $SiO_2$ which is a reaction product. In this step, as described above, when the $O_2$ gas is supplied to the processing container 10, the Ar gas as a ballast gas is introduced into the exhaust pipe 32. Therefore, the amount of the gas discharged from the processing space S2 can be quickly changed to a desired value. Accordingly, the pressure in the processing container 10 (specifically, the partial pressure of the BDEAS gas in the processing space S2) can be quickly set within a desired range as compared with the case where the pressure is regulated by the APC valve 34. Meanwhile, as the valves V2 and V5 are closed, the purge gases supplied from the supply sources 48 and 68 to the gas flow paths 45 and 65 are stored in the gas storage tanks 46 and 66, respectively, whereby the pressures inside the gas storage tanks 46 and 66 are increased.

(Step S8: Discharge of Reaction Gas)

At time t4 in FIG. 9, for example, 0.3 seconds after time $t_3$, the supply of the radio-frequency power is stopped. As shown in FIG. 8, the valves V4 and V10 are closed and the valves V2 and V5 are opened. As a result, the plasma P in the processing container 10 disappears. Further, the supply of the $O_2$ gas into the processing container 10 and the supply of the Ar gas into the exhaust pipe 32 are stopped, the purge gases stored in the gas storage tanks 46 and 66 are supplied into the processing container 10, and the $O_2$ gas is discharged from the processing container 10. That is, the $O_2$ gas atmosphere inside the processing container 10 is replaced with an Ar gas atmosphere. While the inside of the processing container 10 is purged as described above, the valve V4 is closed so that the $O_2$ gas supplied from the supply source 64 to the gas flow path 41 is stored in the gas storage tank 62, whereby the pressure inside the gas storage tank 62 is increased. Further, the valve V10 is closed so that the Ar gas supplied from the supply source 83 to the gas flow path 80 is stored in the gas storage tank 81, whereby the pressure inside the gas storage tank 81 is increased.

At time $t_5$ in FIG. 9, for example, 0.3 seconds after time t4, the valves V2 and V5 are closed and the valves V1 and V10 are opened. As a result, the supply of the purge gas into the processing container 10 is stopped, the Ar gas stored in the gas storage tank 81 is supplied into the exhaust pipe 32, and the BDEAS gas stored in the gas storage tank 42 is supplied into the processing container 10. That is, the above-described step S1 is performed again. Therefore, the time $t_5$ at which the discharge of the reaction gas ends is also the time $t_1$ at which the adsorption step of the BDEAS gas starts. After step S5 is performed, the above-described steps S6 to S8 are performed, and then steps S5 to S8 are further performed. That is, if the above-described steps S5 to S8 are regarded as one cycle, this cycle is repeated to deposit atomic layers of $SiO_2$ on the surface of the wafer W, whereby a $SiO_2$ film is formed. The flow rate of the ballast gas in the adsorption step of step S5 is common between cycles, and the flow rate of the ballast gas in the reaction step of step S7 is common between cycles.

(Step S9: Unloading)

Then, when the film formation is completed by executing the above-described cycle a predetermined number of times, the wafer W is unloaded from the processing container 10 in a procedure opposite to the procedure of loading the wafer W into the processing container 10.

As described above, in the film forming method according to the present embodiment, a cycle including the adsorption step of supplying the BDEAS gas into the processing container 10 to which the exhaust pipe 32 is connected and which accommodates the wafer W, and the reaction step of supplying the $O_2$ gas into the processing container 10 is performed a plurality of times. Then, in the reaction step, the ballast gas is introduced into the exhaust pipe 32, and the plasma of the $O_2$ gas supplied into the processing container 10 is formed. That is, the ballast gas is introduced into the exhaust pipe 32 in the reaction step in which the plasma is formed. Therefore, in the above reaction step, the pressure inside the processing container 10 can be quickly regulated to a desired pressure. Therefore, since each cycle of the PEALD process can be shortened, it is possible to improve the throughput at the time of forming a film by the PEALD process. Further, since the pressure inside the processing container 10 becomes a desired pressure zone in the reaction step in which the plasma of the $O_2$ gas is formed, the proportions of the charged particles and the neutral particles in the plasma can be set to desired proportions. Therefore, isotropic film formation and anisotropic film formation can be appropriately performed, and a $SiO_2$ film having a desired shape can be formed. Furthermore, since the pressure inside the processing container 10 becomes a desired pressure in the reaction step in which the plasma of the $O_2$ gas is formed, the proportion of ions in the charged particles in the plasma and the proportion of radicals in the neutral particles in the plasma can be set to proportions suitable for forming a $SiO_2$ film. Therefore, it is possible to form a high quality $SiO_2$ film. Further, according to the present embodiment, since the use of plasma eliminates the need to raise the temperature of the wafer W to a high temperature, it is possible to form a film having a good film quality. Even if the radio-frequency power conditions (power, etc.) for forming the plasma of the reaction gas such as an $O_2$ gas or the like are adjusted, the proportions of charged particles to neutral particles in the plasma, the proportion of ions in the charged particles and the proportion of radicals in the neutral particles cannot be changed as in the case of regulating the pressure.

By the way, the desired pressure in the processing container 10 in the reaction step may be ½ or less of the desired pressure in the processing container 10 in the adsorption step. For example, the inside of the processing container 10 may have a relatively high pressure of about 5 to 10 Torr in the adsorption step and a low pressure of about 2.5 to 5.0 Torr in the reaction step. The reason that the pressure is kept relatively high in the adsorption step as in the above example is to, for example, allow the adsorption gas to be adsorbed to the inner portion of a recess of the wafer W formed on the surface thereof. Further, the reason that the pressure is kept relatively low in the reaction step as in the above example is to, for example, perform anisotropic film formation using the ions in view of the fact that the proportion of ions to the radicals in the plasma of the $O_2$ gas is larger in the low pressure. Even when the desired pressure in the processing container 10 in the reaction step is ½ or less of the desired pressure in the adsorption step as described above, according to the present embodiment, the pressure inside the processing container 10 can be quickly changed to a desired pressure in the reaction step.

Figure 10:
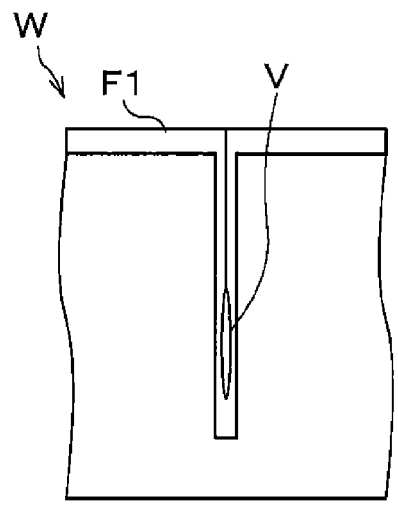
FIG. 10 is a diagram showing an example in which film formation is performed on a wafer having recesses with a high aspect ratio.

In the above example, the flow rate of the ballast gas in the reaction step using the plasma of the $O_2$ gas is common between the cycles. In this case, for example, as shown in FIG. 10, a $SiO_2$ film F1 may continue to be isotropically formed on the wafer W having a recess with a high aspect ratio on the surface thereof, and a void V may be generated. Thus, the flow rate of the ballast gas in the reaction step using the plasma of the $O_2$ gas may be made different between the cycles. In one cycle, the flow rate of the ballast gas may be increased to increase the pressure in the processing container 10, and in another cycle, the flow rate of the ballast gas may be lowered to lower the pressure in the processing container 10. In the $O_2$ gas plasma, the proportion of radicals increases at a high pressure and the proportion of ions increases at a low pressure. Therefore, in one cycle, the $SiO_2$ film is anisotropically formed by the ions in the plasma, and in another cycle, the $SiO_2$ film is isotropically formed by the radicals in the plasma. As a result, it is possible to prevent the generation of the void V.

In the present embodiment, the ballast gas is introduced into the exhaust pipe 32 in the adsorption step also. Therefore, the pressure inside the processing container 10 in the adsorption step can be quickly regulated to a desired pressure. Accordingly, each cycle of the PEALD process can be further shortened, which makes it possible to further improve the throughput when performing the film formation by the PEALD process.

As described above, when the flow rate of the ballast gas in the reaction step using the plasma of the $O_2$ gas is made different between the cycles, it is naturally necessary to make variable the flow rate of the ballast gas supplied to the exhaust pipe 32. Further, when the flow rate of the ballast gas supplied to the exhaust pipe 32 is made common in the adsorption step and the reaction step, if the pressure inside the processing container 10 cannot be brought to a desired pressure at a desired speed in both steps, it is necessary to vary the flow rate of the ballast gas. As a method of varying the flow rate of the ballast gas supplied to the exhaust pipe 32 in this way, there is a method of providing a plurality of ballast gas supply systems.

Further, the ballast gas may be introduced into the exhaust pipe 32 only in the reaction step, and not in the adsorption step. This makes it possible to reduce the number of ballast gas supply systems and to prevent the cost and size of the film forming apparatus 1 from increasing. In the adsorption step, the pressure regulation may not be as precise as in the reaction step. Therefore, from this point as well, the introduction of the ballast gas in the adsorption step may be omitted.

A mass flow controller may be provided, for example, in the gas flow path 80 on the downstream side of the valve V10 in order to vary the flow rate of the ballast gas supplied to the exhaust pipe 32.

Further, an optical sensor for receiving light of a specific wavelength among lights generated from the plasma of the reaction gas may be provided, and the flow rate of the ballast gas supplied to the exhaust pipe 32 in the reaction step may be adjusted (e.g., by using the mass flow controller provided on the downstream side of the valve V10 described above) based on the detection result obtained by the optical sensor. Since the state of the light generated from the plasma varies depending on the proportion of ions and the proportion of radicals in the plasma of the reaction gas, it is possible to bring the proportion of ions and the like to a desired proportion by adjusting the flow rate of the ballast gas as described above.

Further, in the above description, the purge gas is supplied into the processing container 10 to discharge the adsorption gas and the reaction gas. However, the adsorption gas and the reaction gas may be discharged by merely using the evacuation pump 33 without supplying the purge gas. Further, in the above description, the ballast gas is introduced into the exhaust pipe 32 on the upstream side of the APC valve 34. However, the ballast gas may be introduced into the exhaust pipe 32 on the downstream side of the APC valve 34. The timing of starting the introduction of the ballast gas into the exhaust pipe 32 and the timing of starting the supply of the BDEAS gas or the $O_2$ gas may be the same or different. Specifically, the timing of opening the valve V10 for the ballast gas and the timing of opening the valves V1 and V4 for the BDEAS gas and the O₂ gas may be the same or different. For example, when the purge gas is not used as the adsorption gas or the reaction gas, the timing of opening the valves V10 may be earlier than the timing of opening the valves V1 and V4. In addition, the gas supply sources of the carrier gas, the purge gas and the ballast gas may be the same.

In the above description, the film is formed by the ALD process using the O₂ gas plasma, i.e., the oxide plasma. However, the technique according to the present disclosure may also be applied to film formation by ALD process using other plasma such as nitride plasma or the like. Further, the technique according to the present disclosure may also be applied to ALE process using plasma. Furthermore, the technique according to the present disclosure may also be applied to not only the case where in the ALE process using plasma, the desired pressure in the processing container in the step of supplying the second processing gas is ½ or less of the desired pressure in the processing container in the step of supplying the first processing gas, but also the case where the desired pressure in the processing container in the step of supplying the second processing gas is twice or more of the desired pressure in the processing container in the step of supplying the first processing gas. Even in these cases, in the step of supplying the second processing gas, the pressure inside the processing container can be quickly brought to a desired pressure.

The embodiments disclosed herein should be considered to be exemplary in all respects and not limitative. The above-described embodiments may be omitted, replaced or modified in various forms without departing from the scope of the appended claims and their gist.

The following configurations also belong to the technical scope of the present disclosure. (1) A substrate processing method for performing a predetermined process on a substrate, comprising:

performing, a plurality of times, a cycle including (a) supplying a first processing gas into a processing container to which an exhaust pipe is connected and which accommodates the substrate and (b) supplying a second processing gas into the processing container, wherein at least one of (a) and (b) includes (c) introducing a ballast gas into the exhaust pipe and forming plasma of the processing gas supplied into the processing container.

According to (1), the processing container can quickly reach a desired pressure zone in the process of supplying the processing gas into the processing container and forming the plasma of the processing gas in an ALD process or an ALE process using the plasma.

(2) The method of (1), wherein the cycle includes supplying a replacement gas into the processing container to discharge the first processing gas after (a) and before (b), and supplying a replacement gas into the process container to discharge the second processing gas after (b).

(3) The method of (2), wherein the predetermined process is an ALD process, the first processing gas is a raw material gas, and the second processing gas is a reaction gas.

(4) The method of (3), wherein, of (a) and (b), only (b) of supplying a reducing gas as the second processing gas includes (c).

(5) The method of any one of (1) to (4), wherein the pressure in the processing container in (b) is ½ or less or twice or more of the pressure in the processing container in (a).

(6) The method of any one of (1) to (5), wherein the flow rate of the ballast gas in (c) is made different between the cycles, the pressure in the processing container in (c) is increased in one of the cycles, and the pressure in the processing container in (c) is lowered in another cycle.

According to (6), it is possible to combine anisotropic film formation and isotropic film formation, or to combine anisotropic etching and isotropic etching.

(7) A substrate processing apparatus for performing a predetermined process on a substrate, comprising:

a processing container configured to be subjected to depressurization and configured to accommodate the substrate;

a stage provided in the processing container and configured to place the substrate thereon;

a gas introduction part configured to introduce a processing gas into the processing container;

a gas supply mechanism configured to supply a first processing gas and a second processing gas into the processing container via the gas introduction part;

an exhaust pipe configured to connect an exhaust device for evacuating the processing container to the process container;

a ballast gas introduction mechanism configured to introduce a ballast gas into the exhaust pipe; and a controller, wherein at least one of the stage and the gas introduction part is connected to a radio-frequency power source for forming plasma of the processing gas in the processing container, and wherein the controller is configured to control the gas supply mechanism, the ballast gas introduction mechanism, and the radio-frequency power source so that a cycle including (a) supplying the first processing gas into the processing container accommodating the substrate and (b) supplying the second processing gas into the processing container is performed a plurality of times and so that (c) introducing the ballast gas into the exhaust pipe and forming plasma of the processing gas supplied into the processing container is performed in at least one of (a) and (b).

EXPLANATION OF REFERENCE NUMERALS

1: film forming apparatus, 10: processing container, 15: shower head, 20: stage, 30: radio-frequency power source, 31: radio-frequency power source, 32: exhaust pipe, 33: evacuation pump, 100: controller, P: plasma, W: wafer

What is claimed is:

1. A substrate processing method for performing an Atomic Layer Deposition (ALD) process on a substrate, comprising:
    performing, a plurality of times, a cycle including (a) supplying a raw material gas as a first processing gas into a processing container to which an exhaust pipe is connected and which accommodates the substrate and (b) supplying a reaction gas as a second processing gas into the processing container,
    wherein (b) includes (c) introducing a ballast gas into the exhaust pipe to set a pressure in the processing container, forming plasma of the processing gas supplied into the processing container, and setting ratios of charged particles and neutral particles in the plasma of the processing gas contained in the processing container depending on an isotropically formed film or an anisotropically formed film.

2. The method of claim 1, wherein the cycle includes supplying a replacement gas into the processing container to discharge the first processing gas after (a) and before (b), and supplying a replacement gas into the processing container to discharge the second processing gas after (b).

3. The method of claim 1, wherein the pressure in the processing container in (b) is 1/2 or less or twice or more of a pressure in the processing container in (a).

4. The method of claim 3, wherein a flow rate of the ballast gas in (c) is made different between the cycles, a pressure in the processing container in (c) is increased in one of the cycles, and the pressure in the processing container in (c) is lowered in another cycle.

5. The method of claim 1, wherein a flow rate of the ballast gas in (c) is made different between the cycles, a pressure in the processing container in (c) is increased in one of the cycles, and the pressure in the processing container in (c) is lowered in another cycle.

* * * * *